US012689330B2

(12) United States Patent
Elgani et al.

(10) Patent No.: US 12,689,330 B2
(45) Date of Patent: Jul. 21, 2026

(54) TEMPERATURE-COMPENSATED ENVELOPE DETECTOR CIRCUIT

(71) Applicants: STMicroelectronics S.r.l., Agrate Brianza (IT); Alma Mater Studiorum—Universita' Di Bologna, Bologna (IT)

(72) Inventors: Alessia Maria Elgani, Pavia (IT); Matteo D'Addato, Sasso Marconi (IT); Luca Perilli, Teramo (IT); Eleonora Franchi Scarselli, Bologna (IT); Antonio Gnudi, Bologna (IT); Roberto Antonio Canegallo, Rimini (IT); Giulio Ricotti, Broni (IT)

(73) Assignees: STMicroelectronics S.r.l., Agrate Brianza (IT); Alma Mater Studiorum—Universita' Di Bologna, Bologna (IT)

( * ) Notice: Subject to any disclaimer, the term of this patent is extended or adjusted under 35 U.S.C. 154(b) by 572 days.

(21) Appl. No.: 18/191,485

(22) Filed: Mar. 28, 2023

(65) Prior Publication Data

US 2023/0318532 A1      Oct. 5, 2023

(30) Foreign Application Priority Data

Apr. 4, 2022    (IT) ........................ 102022000006650

(51) Int. Cl.
*H03F 1/02*        (2006.01)
*H03F 1/32*        (2006.01)
(52) U.S. Cl.
CPC ............. *H03F 1/0222* (2013.01); *H03F 1/32* (2013.01); *H03F 2200/102* (2013.01)

(58) Field of Classification Search
CPC .... H03F 1/0222; H03F 1/32; H03F 2200/102; H03D 2200/0098; H03D 1/18;
(Continued)

(56) References Cited

U.S. PATENT DOCUMENTS 11,342,885 B2    5/2022  Elgani et al.
2006/0132223 A1  6/2006  Cherek
(Continued)

OTHER PUBLICATIONS

Mangal, V., et al., "Sub-nW Wake-Up Receivers With Gate-Biased Self-Mixers and Time-Encoded Signal Processing", IEEE Journal of Solid-State Circuits, vol. 54, No. 12, Dec. 2019, pp. 3513-3524. (Year: 2019).*

(Continued)

*Primary Examiner* — Regis J Betsch
*Assistant Examiner* — Amit R Bhatia
(74) *Attorney, Agent, or Firm* — Slater Matsil, LLP

(57) ABSTRACT

In accordance with an embodiment, an envelope detector includes a first transistor having a first current conduction terminal coupled to a first connection node; a second current conduction terminal coupled to an intermediate node; and a control terminal coupled to the signal input node and to a biasing node; a second transistor having a first current conduction terminal coupled to the intermediate node; a second current conduction terminal coupled to a second connection node; and a control terminal coupled to the biasing node; and a first temperature compensating transistor that is diode-connected and coupled between a compensation output node and the biasing node. The second connection node is coupled to the compensation output node and the first connection node is coupled to a detector output.

19 Claims, 3 Drawing Sheets

(58) Field of Classification Search

CPC ..... H04L 43/0817; H04L 27/04; H04L 27/06; H04L 27/08

See application file for complete search history.

(56) References Cited

U.S. PATENT DOCUMENTS

| 2007/0241809 A1* | 10/2007 | Kothandaraman .... | G11C 5/147 |
| | | | 327/539 |
| 2010/0308902 A1 | 12/2010 | Iriarte et al. | |

OTHER PUBLICATIONS

Elgani, A., et al., "A Clockless Temperature-Compensated Nanowatt Analog Front-End for Wake-Up Radios Based on a Band-Pass Envelope Detector", IEEE Transactions on Circuits and Systems—I: Regular Papers, vol. 67, No. 8, Aug. 2020, pp. 2612-2624.

Mangal, V., et al., "Sub-nW Wake-Up Receivers With Gate-Biased Self-Mixers and Time-Encoded Signal Processing", IEEE Journal of Solid-State Circuits, vol. 54, No. 12, Dec. 2019, pp. 3513-3524.

Zhang, J., et al., "A fully integrated analog front-end circuit for 13.56 MHz passive RFID tags in conformance with ISO/IEC 18000-3 protocol", Microelectronics Journal 45, May 4, 2014, pp. 578-588.

* cited by examiner

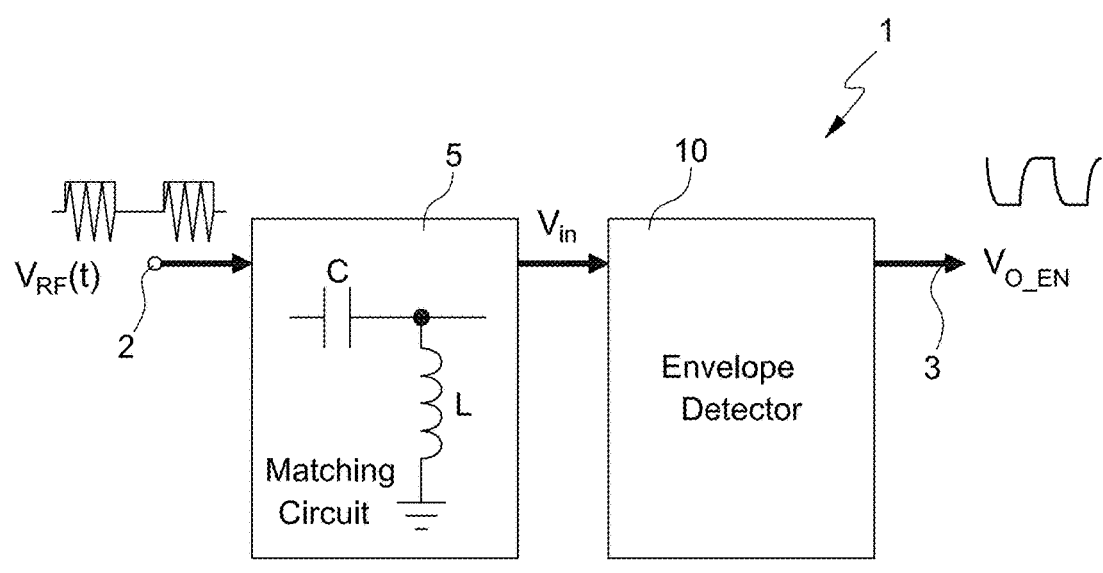
FIG. 1
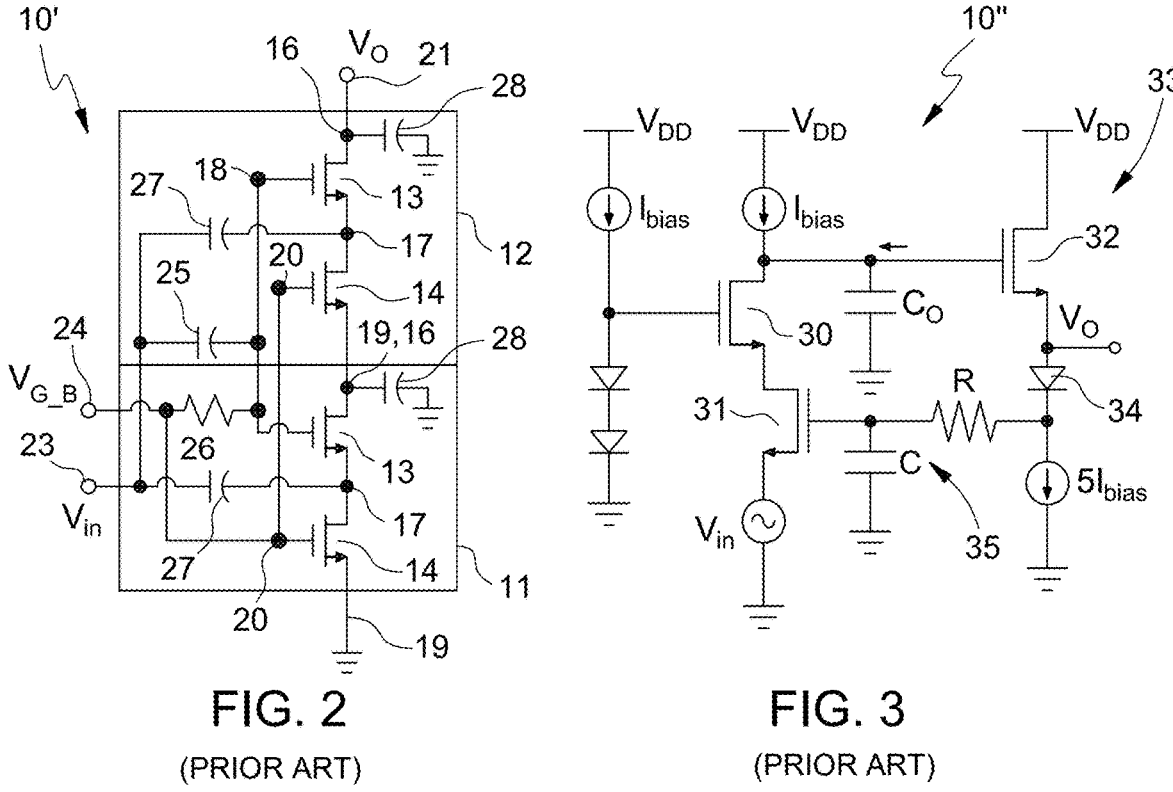
FIG. 2
(PRIOR ART)
FIG. 3
(PRIOR ART)

TEMPERATURE-COMPENSATED ENVELOPE DETECTOR CIRCUIT

CROSS-REFERENCE TO RELATED APPLICATIONS

This application claims the benefit of Italian Application No. 102022000006650, filed on Apr. 4, 2022, which application is hereby incorporated herein by reference.

TECHNICAL FIELD

The present invention relates to a temperature-compensated envelope detector circuit.

BACKGROUND

As is known, an envelope detector is a circuit able to transform an input signal, generally high-frequency, into an output signal that reproduces the envelope of the input signal.

Envelope detectors are traditionally used in telecommunications and are becoming increasingly used in low-power wireless sensor networks used for IoT (Internet on Things). For example, envelope detectors are used for amplitude modulated signals, such as digital On-off keying (OOK) modulated signals, that is signals that code digital data as the presence or absence of a carrier wave.

In the following, an envelope detector will be discussed for use in the demodulation of OOK modulated signals.

FIG. 1 shows a demodulating device 1. Demodulating device 1 has an input 2 receiving an OOK modulated, input signal (modulated input signal $V_{RF}(t)=V_{OOK}(t)\cos(\omega t)$, wherein $V_{OOK}(t)$ is a modulating, envelope signal and co is the frequency of a carrier wave) and an output 3 supplying a demodulated signal (output signal $V_{o\_EN}$).

Demodulating device 1 of FIG. 1 comprises a matching circuit 5 and an envelope detector 10, that are cascade-coupled between the input 2 and the output 3.

The matching circuit 5 may be an LC circuit, as schematically shown in FIG. 1, whose aim is to match impedances at frequency co and provide passive gain. Matching circuit 5 generates input voltage $V_{in}$, basically amplified with respect to modulated input signal $V_{RF}(t)$.

The envelope detector 10 may be a passive type or an active type. FIG. 2 shows an implementation of a passive-type envelope detector 10'; FIG. 3 shows an implementation of an active-type envelope detector 10".

Envelope detector 10' of FIG. 2 is disclosed, e.g., in "Sub-nW Wake-Up Receivers With Gate-Biased Self-Mixers and Time-Encoded Signal Processing", V. Mangal et al., IEEE Journal of Solid-State Circuits, Vol 54. No 12, December 2019.

Envelope detector 10' is a multi-stage self-mixer envelope detector including a plurality of two-transistor modules (in FIG. 2, two modules, referred hereinafter as first module 11 and second module 12), that are cascade-coupled.

Each module 11, 12 comprises a first extraction transistor 13 and a second extraction transistor 14, series-coupled.

Here, extraction transistors 13, 14 are NMOS type and have the same structure, and in particular, are formed using the same technology and have same geometrical shape and same dimensions.

First extraction transistor 13 of each module 11, 12 is coupled to a first connection node 16 with its drain terminal; to an intermediate node 17 with its source terminal; and to a first control node 18 with its gate terminal.

Second extraction transistor 14 of each module 11, 12 is coupled to intermediate node 17 with its drain terminal; to a second connection node 19 with its source terminal; and to a second control node 20 with its gate terminal.

First connection node 16 of a first module in the cascade (for example, here, of first module 11) is coupled to an output node 21. Output node 21 is coupled to output 3 of the demodulating device 1 of FIG. 1.

Second connection node 19 of each module (for example, here, first module 11) is coupled with the first connection node 16 of a subsequent module in the cascade sequence (that is, of the module that is farther, from output node 21, than the considered module; here, with the first connection node 16 of second module 12).

Second connection node 19 of a last module in the cascade sequence (here, of second module 12) is coupled to ground.

First control nodes 18 of modules 11, 12 are coupled together and to a signal input 23 through a first coupling capacitor 25; first control nodes 18 of modules 11, 12 are also coupled to a biasing input 24 through a resistor 26.

Second control nodes 20 of modules 11, 12 are directly coupled to biasing input 24.

Signal input 23 receives input voltage $V_{in}$; biasing input 24 receives gate biasing voltage $V_{GB}$.

Intermediate nodes 17 are coupled to signal input 23 through (own) second coupling capacitors 27.

First and second capacitors 25, 27 have a same capacitance $C_C$.

First connection nodes 16 of all modules (and thus second connection nodes 19 of all but the last module, here second module 12) are coupled to ground through a third coupling capacitor 28 having capacitance $C_L$.

The last module of the cascade sequence (here, of second module 12) may have its second connection node 19 directly coupled to ground.

As demonstrated in the aforementioned article by V. Mangal et al., envelope detector 10' exploits the exponential subthreshold characteristic of MOS transistors; in particular, second-order non-linearities of envelope detector 10' result in an envelope-dependent part of the current at baseband. In other words, the high frequency, modulated input signal $V_{RF}(t)$ at input 2 of the envelope detector 1 of FIG. 1 is transformed into the demodulated output signal $V_{O\_EN}$ of same FIG. 1.

In this circuit, the first and the second extraction transistors 13, 14 are biased at DC zero-current. As a result, the envelope detector 10' of FIG. 2 has zero DC power consumption and is free from flicker noise.

In addition, the external matching network sees it as a parallel RC load.

Specifically, the channel resistance of extraction transistors 13, 14, $r_{DS}$, is determined by a DC voltage (gate biasing voltage $V_{GB}$) and, in turn, determines the input resistance Rin seen by the previous stage (matching circuit 5 in FIG. 1). Thus, by virtue of the gate biasing of the extraction transistors 13, 14, in the envelope detector 10', it is possible to choose the input resistance in order to optimize sensitivity.

However, the envelope detector 10' has a significant decrease in sensitivity, in case of operation at temperatures different from the nominal one (e.g., room temperature).

This drawback is the more evident in case of external gate biasing voltage $V_{GB}$.

Envelope detector 10" shown in FIG. 3 is disclosed, e.g., in "A Clockless Temperature-Compensated Nanowatt Analog Front-End for Wake-Up Radios Based on a Band-Pass Envelope Detector", A. M. Elgani et al., IEEE Transactions on Circuits and Systems I: Regular Papers, Vol. 67, No. 8 August 2020.

Envelope detector 10" is an active envelope edge detector also based on MOS transistors operating in the sub-threshold region. In particular, envelope detector 10" comprises a cascode pair (cascode transistors 30 and 31) operating as a common gate amplifier, and a feedback loop 33 including a follower transistor 32, a diode 34 and an RC filter 35. The cascode pair 30, 31 has the aim of boosting the gain, while the feedback loop 33 provides the bias to the gate of cascode transistor 31, which is thus self-biased.

Envelope detector 10" has a band-pass response and generates a peak in the output voltage when a change in a received bit is detected.

Although envelope detector 10" of FIG. 3 is very compact (it comprises only a few branches) it consumes more current than the passive circuit of FIG. 2 (the MOSFET transistors of envelope detector 10" that perform demodulation are not biased at zero current) and is affected by flicker noise, that may cause sensitivity degradation.

SUMMARY

In accordance with an embodiment, an envelope detector circuit includes: an envelope extracting portion comprising a first connection node, a second connection node, a signal input node configured to receive an input voltage, a biasing node, and an extraction branch comprising an extraction module having a first extraction transistor and a second extraction transistor, wherein: the first extraction transistor and the second extraction transistor are coupled to an intermediate node, the first extraction transistor comprises a first current conduction terminal coupled to the first connection node, a second current conduction terminal coupled to the intermediate node, and a control terminal coupled to the signal input node and to the biasing node, and the second extraction transistor comprises a first current conduction terminal coupled to the intermediate node, a second current conduction terminal coupled to the second connection node; and a control terminal coupled to the biasing node; and a temperature compensating portion having a compensation output node coupled to the biasing node and including a first temperature compensating transistor; the first temperature compensating transistor being diode-connected, coupled between the compensation output node and the biasing node and configured to operate in a subthreshold condition, wherein one of the first connection node or the second connection node is coupled to the compensation output node and another of the first connection node or the second connection node is coupled to a detector output of the envelope detector circuit.

In accordance with another embodiment, an envelope detector includes: a proportional to absolute temperature (PTAT) bias circuit comprising a diode-connected transistor configured to conduct a PTAT current, and a first bias transistor having a conduction terminal coupled to a gate of the diode-connected transistor, wherein the gate of the diode-connected transistor is coupled to a conduction terminal bias node and a gate of the first bias transistor is coupled to a gate bias node; a first detection branch comprising: a first transistor having a conduction path coupled between the conduction terminal bias node and a first intermediate node, and a gate resistively coupled to the conduction terminal bias node and capacitively coupled to an RF input node, and a second transistor having a conduction path coupled between the first intermediate node and a first detector output node, and a gate coupled to the conduction terminal bias node, wherein the first intermediate node is capacitively coupled to the RF input node; and a second detection branch comprising: a third transistor having a conduction path coupled between the conduction terminal bias node and a second intermediate node, and a gate coupled to the conduction terminal bias node, and a fourth transistor having a conduction path coupled between the second intermediate node and a second detector output node, and a gate resistively coupled to the conduction terminal bias node and capacitively coupled to the RF input node, wherein the second intermediate node is capacitively coupled to the RF input node.

In accordance with a further embodiment, a method of detecting an envelope, includes: detecting an RF signal using a first branch circuit comprising a first transistor having a conduction path coupled between a first detection output and a first intermediate node, and a second transistor having a conduction path coupled between a the first intermediate node and a first bias node to provide a first envelope signal at the first detection output; detecting the RF signal using a second branch circuit comprising a third transistor having a conduction path coupled between a second detection output and a second intermediate node, and a fourth transistor having a conduction path coupled between the second intermediate node and the first bias node to provide a second envelope signal at the first detection output; and biasing the first transistor, the second transistor, the third transistor and the fourth transistor to have a temperature compensated channel resistance

BRIEF DESCRIPTION OF THE DRAWINGS

For the understanding of the present invention, embodiments thereof are now described, purely as a non-limitative examples, with reference to the enclosed drawings, wherein:

FIG. 1 is a schematic block diagram of a demodulating device including an envelope detector;

FIG. 2 is a schematic circuit diagram of an embodiment of a known envelope detector that may be used in the demodulating device of FIG. 1;

FIG. 3 is a schematic circuit diagram of an embodiment of another known envelope detector that may be used in the demodulating device of FIG. 1;

DETAILED DESCRIPTION OF ILLUSTRATIVE EMBODIMENTS

Figure 4:
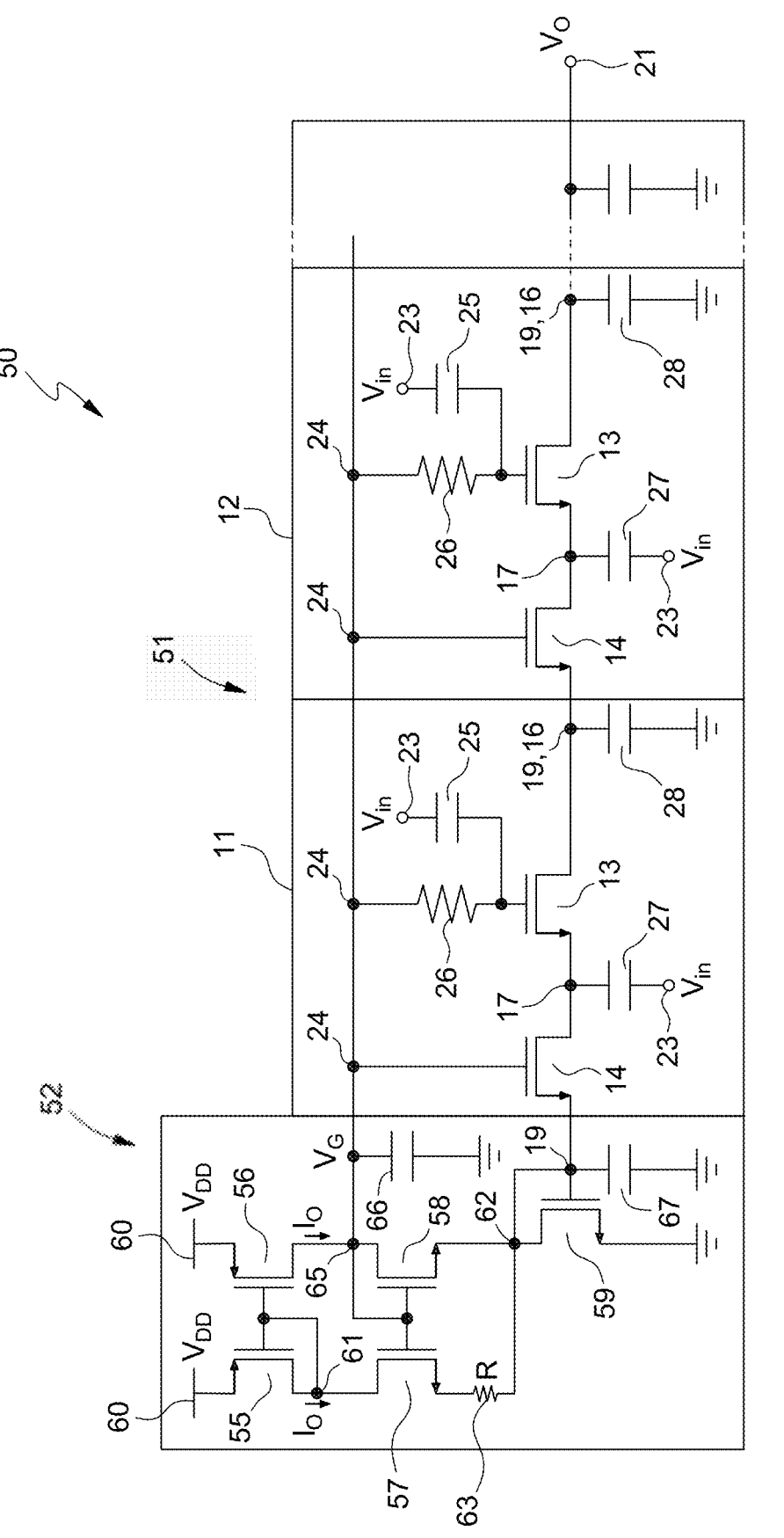
FIG. 4 is a schematic circuit diagram of an embodiment of the present envelope detector.

FIG. 4 shows an envelope detector 50 that may be used in the demodulating device 1 of FIG. 1. As shown, envelope detector 50 includes an envelope extracting portion 51 and a temperature compensating circuit 52. Envelope extracting portion 51 has a general structure similar to the general structure of the envelope detector 10' of FIG. 2.

Therefore, the modules and the components of envelope extracting portion 51 in common with the envelope detector 10' of FIG. 2 are indicated by the same reference numbers, and the description of the structure and connection thereof are not repeated, except for where useful for the comprehension.

In particular, envelope extracting portion 51 is of passive type and includes a plurality of modules 11, 12 that are cascade coupled and have the same structure and connections of modules 11, 12 of FIG. 2.

Also here, only two modules 11, 12 that are adjacent in the cascade sequence are shown, but, in general, many modules may be comprised in the envelope extracting portion 51.

Also here, modules 11, 12 have signal input nodes 23 receiving the signal to be demodulated, also indicated as input voltage $V_{in}$; in addition, modules 11, 12 have biasing nodes 24, receiving biasing voltage $V_G$. Biasing voltage $V_G$ is here generated by temperature compensating circuit 52 aimed at generating biasing voltage $V_G$ so that dependency of the sensitivity of the envelope detector 50 on temperature is minimized. Specifically, temperature compensating circuit 52 is a Proportional-To-Absolute-Temperature (PTAT) circuit comprising here five PTAT transistors 55-59, of MOS type, working in subthreshold condition. PTAT transistors 55-59 are also called first, second, third, fourth and fifth PTAT transistors 55-59, hereinafter.

In detail, first PTAT transistor 55, here of PMOS type, is diode-connected and is coupled between a supply line 60 at voltage $V_{DD}$ and a first PTAT node 61. Therefore, first PTAT transistor 55 has its source terminal coupled to supply line 60 and its gate and drain terminals coupled together at first PTAT node 61. Second PTAT transistor 56, here also of PMOS type, is mirror-like coupled to first PTAT transistor 55. Thus, second PTAT transistor 56 has its source terminal coupled to supply line 60 and its gate terminal coupled to the gate terminal of first PTAT transistor 55. The drain terminal of second PTAT transistor 56 forms a PTAT output node 65, which is coupled to biasing nodes 24 of envelope extracting portion 51.

Third PTAT transistor 57, here of NMOS type, has its drain terminal coupled to first PTAT node 61; its source terminal coupled to a second PTAT node 62 through a resistor 63, and its gate terminal coupled to PTAT output node 65.

Fourth PTAT transistor 58, here of NMOS type, is diode-connected (mirror-like with third PTAT transistor 57) and is coupled between PTAT output node 65 and second PTAT node 62. Therefore, fourth PTAT transistor 58 has its gate and drain terminals coupled together and to PTAT output node 65 and its source terminal coupled to second PTAT node 62.

Fifth PTAT transistor 59, here of is of NMOS type, is also diode-connected and coupled between second PTAT node 62 and ground. Thus, it has its gate and drain terminals coupled together and to second PTAT node 62 and its source terminal coupled to ground.

A first filtering capacitor 66 is coupled between PTAT output node 65 and a reference potential line (here, ground) for preventing input voltage $V_{in}$ from entering the temperature compensating circuit 52. A second filtering capacitor 67 is coupled between the gate terminal of fifth PTAT transistor 59 (second connection node 19 of first module 11) and ground, also for preventing filtered input voltage $V_{in}$ from entering the temperature compensating circuit 52. A further filtering capacitor (not shown) may be coupled between the gates of first and second PTAT transistors 55, 56 and ground, to filter noise of the current mirror. First and second filtering capacitors 66, 67 may be much bigger than third coupling capacitors 28.

As indicated above and demonstrated below, by configuring the temperature compensating circuit 52 so that PTAT transistors 55-59 operate in subthreshold condition, biasing voltage $V_G$ generated by temperature compensating circuit 52 allows sensitivity of the envelope detector 50 to be temperature compensated.

In fact, as discussed in the above-mentioned article by V. Mangal et al., the sensitivity of envelope extracting portion 51 strongly depends on the input resistance $R_{in}$ seen between signal input nodes 23 and ground. In particular, input resistance $R_{in}$ is strongly dependent on the drain-to-source resistance $R_{DS}$ of extraction transistors 13, 14 (and precisely, of all drain-to-source resistances $R_{DS}$ of extraction transistors 13, 14 of all modules 11, 12). Thus, according to this disclosure, in order to have a temperature-compensated sensitivity of the envelope detector 50, temperature compensating circuit 52 generates a biasing voltage $V_G$ causing the drain-to-source resistance $R_{DS}$ of extraction transistors 13, 14 to be substantially unaffected by temperature, as demonstrated by the equations below.

As known in the art, conductance $g_{DS}$ (which is the inverse of its drain-to-source resistance $R_{DS}$) of a transistor, such as extraction transistor 13, 14, may be calculated as follows.

$$g_{DS} = \frac{\partial I_D}{\partial V_{DS}},$$

where $I_D$ is the drain current and $V_{DS}$ is the drain to source voltage of extraction transistor 13, 14.

As known, see, e.g., Analysis and Design of Analog Integrated Circuits, Gray, Hurst, Lewis, Meyer, 5th Edition, for a transistor working in subthreshold condition, drain current $I_D$ is:

$$I_D = \frac{W}{L} I_T e^{\frac{V_{GS} - V_{th}}{nV_T}} \left[ 1 - e^{-\frac{V_{DS}}{V_T}} \right], \tag{1}$$

Where, W and L are the width and length of the gate regions of extraction transistors 13, 14; $I_T$ is the reverse saturation current of a PN junction, referred to extraction transistors 13, 14, related to the used technology; $V_{GS}$ is the gate to source voltage of extraction transistors 13, 14; $V_{th}$ is the MOS threshold voltage; $V_T$ is the thermal voltage; and n is slope factor, given by $n=1+C_{dep}/C_{ox}$ (wherein $C_{dep}$ is the capacitance of the depletion layer and $C_{ox}$ is the capacitance of the oxide layer of extraction transistors 13, 14).

By differentiating equation (1) and considering that, for a transistor working in subthreshold condition with a small $V_{DS}$ (drain to source voltage, tending to zero), it is possible to use the following approximation:

$$e^{-\frac{V_{DS}}{V_T}} \sim 1$$

with a few calculations, the equation (2) below may be obtained:

$$g_{DS} = \frac{1}{V_T} \left( \frac{W}{L} \right) I_T \; e^{-\frac{V_{th}}{nV_T}} e^{\frac{V_{GS}}{nV_T}}, \tag{2}$$

which, for transistors 13, 14 may be written as:

$$g_{DS,Tr} = \frac{1}{V_T} I_{T,Tr} \; e^{-\frac{V_{th,Tr}}{nV_T}} \left( \frac{W}{L} \right)_{Tr} \; e^{\frac{V_{GS,Tr}}{nV_T}}. \tag{3}$$

Since fourth PTAT transistor 58 is coupled in parallel to the gate-to-source junction of extraction transistors 13, 14, their gate-to-source voltages $V_{GS}$ are the same, thus:

$$V_{GS,Tr} = V_{GS,58}.$$

In addition, by neglecting any differences between the drain-to-source voltages of fourth PTAT transistor 58 and extraction transistors 13, 14, their reverse saturation currents $I_T$ and their threshold voltages $V_{th}$ are also the same:

$$I_{T,Tr} \sim I_{T,58}; \; V_{th,Tr} \sim V_{th,58} \tag{4}$$

Considering the above, equation (3) may be rewritten as:

$$g_{DS,Tr} = \frac{1}{V_T} I_{T,58} \; e^{-\frac{V_{th,58}}{nV_T}} \left(\frac{W}{L}\right)_{Tr} e^{\frac{V_{GS,58}}{nV_T}} \tag{5}$$

by defining:

$$I_{S,58} = I_{T,58} \; e^{-\frac{V_{th,58}}{nV_T}}, \tag{6}$$

where $I_{T,58}$ is the reverse saturation current of PN junction for fourth PTAT transistor 58, related to the used technology, equation (5) may thus be rewritten as:

$$g_{DS,Tr} = \frac{1}{V_T} I_{S,58} \; \left(\frac{W}{L}\right)_{Tr} e^{\frac{V_{GS,58}}{nV_T}}. \tag{7}$$

In addition:

$$I_{DC,58} = I_{s,58} \left(\frac{W}{L}\right)_{58} e^{\frac{V_{GS,58}}{nV_T}}, \tag{8}$$

where $I_{DC,58}$ is the direct current through fourth PTAT transistor 58 (bias current of fourth PTAT transistor 58).

Substituting equation (8) in equation (7), we obtain:

$$g_{DS,Tr} \sim \frac{I_{DC,58}}{V_T} \frac{(W/L)_{Tr}}{(W/L)_{58}}. \tag{9}$$

On the other hand, third PTAT transistor 57 and fourth PTAT transistor 58 are mirror-like coupled and thus have same drain currents:

$$I_{D,57} = I_{D,58}$$

and work in a subthreshold condition. By dimensioning PTAT transistors 57, 58 so that:

$$\left(\frac{W}{L}\right)_{57} = N\left(\frac{W}{L}\right)_{58}.$$

It may be demonstrated that $$I_{57} = \frac{nV_T \ln N}{R}, \tag{10}$$

where R is the resistance of resistor 63. By inserting equation (10) into equation (9), we have:

$$I_{DC,58} \sim \frac{nV_T \ln \frac{(W/L)_{57}}{(W/L)_{58}}}{R} \tag{11}$$

so that equation (9) becomes:

$$g_{DS} \sim \frac{n \ln \frac{(W/L)_{57}}{(W/L)_{58}}}{R} \frac{(W/L)_{Tr}}{(W/L)_{58}}, \tag{12}$$

which is dependent on only geometrical factors and is thus independent from temperature. Accordingly, the input resistance and thus the sensitivity of the envelope detector 50 is temperature compensated by temperature compensating circuit 52.

Figure 5:
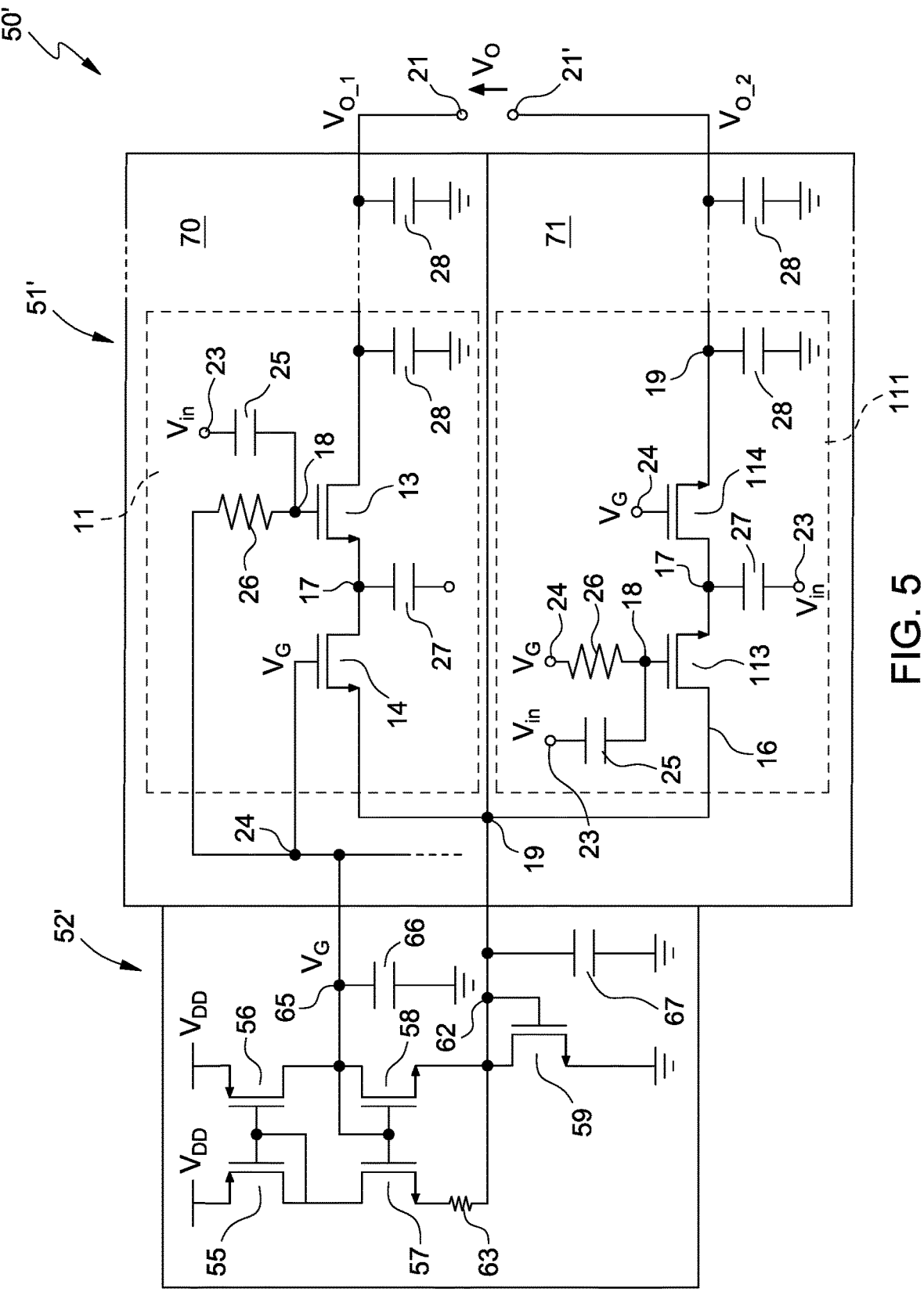
FIG. 5 is a schematic circuit diagram of another embodiment of the present envelope detector.

FIG. 5 shows an envelope detector 50' that is noise-compensated.

In fact, the addition of temperature compensating circuit 52 may cause introduction of noise, both thermal and flicker, that may be propagated through envelope extracting portion 51. To solve this issue, envelope detector 50' of FIG. 5 uses a differential approach. To this end, envelope detector 50' again includes an envelope extracting portion, here identified by reference number 51', and a temperature compensating circuit, here identified by reference number 52'. Temperature compensating circuit 52' is exactly the same as temperature compensating circuit 52 of FIG. 4.

Envelope extracting portion 51' comprises a first and a second branch 70, 71, wherein one of them (here, first branch 70) is exactly the same as the envelope extracting portion 51 of FIG. 4 and the other (here, second branch 71) has exchanged connections to cause an opposite current flow.

Therefore, since the basic elements of envelope detector 50' of FIG. 5 are the same as for the envelope detector 50 of FIG. 4, they have been identified by the same reference numbers and the following description regards only the different connections of the second branch 71.

It is worth noting that envelope extracting portion 51' of FIG. 5 shows a single module 11 for the first branch 70. Also here, more than one module may be provided; in this case, further modules, such as second module 12 in FIG. 4 may be cascade connected. In this case, first and second branch 70, 71 have the same number of modules 11, 12. Analogously, the second branch 71 of envelope extracting portion 51' has a single module, indicated as module 1n, but further modules, with exactly the same structure as module 111, may be cascade connected to module 111.

In FIG. 5, the extraction transistors of module 111, to be compared with first and second extraction transistors 13, 14, are indicated as third and fourth extraction transistors 113, 114. In detail, the third extraction transistor 113 (coupled with input voltage $V_{in}$) of the second branch 71 is here coupled to first connection node 16 and to PTAT output node 65 with its drain terminal; to the intermediate node 17 with its source terminal; and to the first control node 18 with its gate terminal. The fourth extraction transistor 114 of the second branch 71 is coupled to intermediate node 17 with its drain terminal; to second connection node 19 with its source terminal; and to biasing input 24 with its gate terminal.

First and second branches 70, 71 work independently and generate opposite output voltages $V_{o1}$ and $V_{o2}$ at output 21 and 21', respectively, where the noise generated by temperature compensating circuit 52 is propagated in the same way in both branches 70, 71. Therefore, the noise generated by temperature compensating circuit 52 (seen as common-mode) is cancelled out at the differential output $V_{o1}-V_{o2}$.

In various embodiments, the total signal-to-noise ratio SNR of envelope detector 50' does not change from single ended solution of envelope detector 50 of FIG. 4. In particular, assuming that both the single-ended envelope detector 50 of FIG. 4 and the differential-ended envelope detector 50' of FIG. 5 are coupled to a respective amplifier (single-input amplifier and differential amplifier, respectively, neither shown), the two amplifiers have the same noise factor. In fact:

$$NF_{DIFF} = 1 + \frac{4}{\frac{gm}{2}(2k)^2 R_{in}} = NF_{SE},$$

where $NF_{DIFF}$ is the noise factor of the differential amplifier coupled to outputs 21, 21' of envelope detector 50' of FIG. 5, $g_m$ is the transconductance of the amplifiers (which are biased with a same current; wherein the amplifiers are assumed to produce no flicker noise); k is the number of extraction transistors 13, 14; 113, 114 in each branch 70, 71, $R_{in}$ is the input resistance seen between signal input nodes 23 and ground and $NF_{SE}$ is the noise factor of a single-input amplifier coupled to output 21 of envelope detector 50 of FIG. 4.

In addition to the SNR, the envelope extracting portion 51' of FIG. 5 does not negatively affect power consumption or delay.

The advantages of embodiment envelope detectors are clear from the description above. For example, some embodiment envelope detector advantageously have a sensitivity with minimized dependence on temperature. Furthermore, the disclosed embodiments do not require any external DC voltages; the extraction transistors are self-biased through the temperature compensating circuit 52, thus limiting power consumption. The differential approach prevents sensitivity degradation due to the noise of temperature compensating circuit 52.

Finally, it is clear that numerous variations and modifications may be made to the device described and illustrated herein, all falling within the scope of the invention as defined in the attached claims. For example, the single-ended solution may use the connection structure of second branch 71 of FIG. 5, instead of the one shown in FIG. 4.

In addition, fifth PTAT transistor 59 may be replaced by a plurality of diode-connected transistors, series-coupled on top of each other, depending on the DC output voltage $V_o$, $V_{o1}$, $V_{o2}$ desired by a subsequent amplifier to operate correctly. The current mirror formed by first and second PTAT transistors 55, 56 may include a higher number of transistors and/or be implemented by a more complicated mirror topology; bipolar transistors may be used instead of MOS transistors; and/or resistor 63 may be implemented through an MOS transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

In the claims, in order to facilitate interpretation with respect to the above description:

the fourth PTAT transistor 58 may be a specific example of a first temperature compensating transistor;

the first and second PTAT transistors 55, 56 may be specific examples of a second temperature compensating transistor and a third temperature compensating transistor, respectively;

the third PTAT transistor 57 may be a specific example of a fourth temperature compensating transistor;

the fifth PTAT transistor 59 may be a specific example of a fifth temperature compensating transistor; and the second PTAT node 62 and the PTAT output node 65 may be specific examples of a first compensation output node and a second compensation output node, respectively.

In the claims, in order to facilitate interpretation with respect to the above description:

the fifth PTAT transistor 59 may be a specific example of a diode-connected transistor;

the fourth PTAT transistor 58 may be a specific example of a first bias transistor; and the second PTAT node 62 and the PTAT output node 65 may be specific examples of a conduction terminal bias node and a gate bias node, respectively.

What is claimed is:

1. An envelope detector circuit comprising:

an envelope extracting portion comprising a first connection node, a second connection node, a signal input node configured to receive an input voltage, a biasing node, and an extraction branch comprising an extraction module having a first extraction transistor and a second extraction transistor, wherein:

the first extraction transistor and the second extraction transistor are coupled to an intermediate node, the first extraction transistor comprises a first current conduction terminal coupled to the first connection node, a second current conduction terminal coupled to the intermediate node, and a control terminal coupled to the signal input node and to the biasing node, and the second extraction transistor comprises a first current conduction terminal coupled to the intermediate node, a second current conduction terminal coupled to the second connection node; and a control terminal coupled to the biasing node; and a temperature compensating portion having a first compensation output node and a second compensation output node, wherein the first compensation output node is directly connected to the second connection node, wherein the second compensation output node is connected to the biasing node, and wherein the temperature compensating portion includes a first temperature compensating transistor, the first temperature compensating transistor being diode-connected, coupled between the first and second compensation output nodes and configured to operate in a subthreshold condition.

2. The envelope detector circuit according to claim 1, wherein the temperature compensating portion further comprises:

a second temperature compensating transistor, the second temperature compensating transistor being diode-connected and coupled between a supply line and the second compensation output node, a third temperature compensating transistor, the third temperature compensating transistor being mirror-like coupled to the second temperature compensating transistor and coupled between the supply line and the second compensation output node;

a fourth temperature compensating transistor, the fourth temperature compensating transistor being mirror-like coupled to the first temperature compensating transistor and coupled between the first and second compensation output nodes;

a fifth temperature compensating transistor, the fifth temperature compensating transistor being diode-connected and coupled between the first compensation output node and a reference potential line; and a resistor element coupled between the fourth temperature compensating transistor and the first compensation output node.

3. The envelope detector circuit according to claim 2, wherein the first, the fourth and the fifth temperature compensating transistors are NMOS type transistors, and the second and the third temperature compensating transistors are PMOS type transistors.

4. The envelope detector circuit of claim 2, wherein the first and fourth temperature compensating transistors comprise a respective gate region each characterized by respective widths and lengths, wherein a ratio between the width and length of the gate region of the fourth temperature compensating transistor is N times a ratio between the width and length of the gate region of the first temperature compensating transistor, with N greater than 1.

5. The envelope detector circuit according to claim 1, wherein the extraction module is a first extraction module and the extraction branch comprises a plurality of further extraction modules, the first extraction module and the plurality of further extraction modules being cascade-coupled.

6. The envelope detector circuit according to claim 1, wherein the first current conduction terminal of the first extraction transistor is coupled to a detector output of the envelope detector circuit, and the second current conduction terminal of the second extraction transistor is coupled to the second connection node.

7. The envelope detector circuit according to claim 6, wherein:

the extraction branch is a first extraction branch;

the extraction module is a first extraction module;

the envelope extracting portion comprises a second extraction branch; and the second extraction branch includes a second extraction module comprising:

a third extraction transistor having a first current conduction terminal coupled to the first connection node, a second current conduction terminal coupled to the intermediate node, and a control terminal coupled to the signal input node and to the biasing node, and a fourth extraction transistor having a first current conduction terminal coupled to the intermediate node, a second current conduction terminal coupled to the second connection node, and a control terminal coupled to the biasing node.

8. The envelope detector circuit according to claim 7, wherein the first current conduction terminal of the third extraction transistor is coupled to the second connection node and the second current conduction terminal of the fourth extraction transistor is coupled to the detector output.

9. An envelope detector comprising:

a proportional to absolute temperature (PTAT) bias circuit comprising a diode-connected transistor configured to conduct a PTAT current, and a first bias transistor having a conduction terminal coupled to a gate of the diode-connected transistor, wherein the gate of the diode-connected transistor is coupled to a conduction terminal bias node and a gate of the first bias transistor is coupled to a gate bias node;

a first detection branch comprising:

a first transistor having a conduction path coupled between the conduction terminal bias node and a first intermediate node, and a gate resistively coupled to the gate bias node and capacitively coupled to an RF input node, and a second transistor having a conduction path coupled between the first intermediate node and a first detector output node, and a gate coupled to the gate bias node, wherein the first intermediate node is capacitively coupled to the RF input node; and a second detection branch comprising:

a third transistor having a conduction path coupled between the conduction terminal bias node and a second intermediate node, and a gate coupled to the gate bias node, and a fourth transistor having a conduction path coupled between the second intermediate node and a second detector output node, and a gate resistively coupled to the gate bias node and capacitively coupled to the RF input node, wherein the second intermediate node is capacitively coupled to the RF input node, wherein the first detector output node and the second detector output node are configured to provide a differential signal representative of an envelope of a signal at the RF input node.

10. The envelope detector of claim 9, wherein the conduction terminal bias node and the gate bias node are configured to bias the first transistor, the second transistor, the third transistor, and the fourth transistor to have a temperature compensated channel resistance.

11. The envelope detector of claim 9, wherein noise generated by the PTAT bias circuit is configured to have a higher power in a common mode portion of a signal generated by the first detector output node and the second detector output node than in the differential signal representative of the envelope of the signal at the RF input node.

12. The envelope detector of claim 9, wherein the first transistor, the second transistor, the third transistor and the fourth transistor are NMOS transistors.

13. The envelope detector of claim 9, wherein the PTAT bias circuit further comprises:

a second bias transistor having a conduction path coupled between a power supply node and a third intermediate node, the second bias transistor being diode-connected;

a bias resistor having a first terminal coupled to a gate of the diode-connected transistor;

a third bias transistor having a conduction path coupled between the third intermediate node and a second terminal of the bias resistor; and a fourth bias transistor having a conduction path coupled between the power supply node and a conduction path of the first bias transistor, wherein the first bias transistor is diode-connected.

14. The envelope detector of claim 9, further comprising:

a first capacitor coupled between the first detector output node and a reference node; and a second capacitor coupled between the second detector output node and the reference node.

15. An envelope detector circuit comprising:

an envelope extracting portion comprising a first connection node, a second connection node, a signal input node configured to receive an input voltage, a biasing node, and an extraction branch comprising an extraction module having a first extraction transistor and a second extraction transistor, wherein:

the first extraction transistor and the second extraction transistor are coupled to an intermediate node, the first extraction transistor comprises a first current conduction terminal coupled to the first connection node, a second current conduction terminal coupled to the intermediate node, and a control terminal coupled to the signal input node and to the biasing node, and the second extraction transistor comprises a first current conduction terminal coupled to the intermediate node, a second current conduction terminal coupled to the second connection node; and a control terminal coupled to the biasing node; and a temperature compensating portion having a first compensation output node and a second compensation output node, wherein the first compensation output node is directly connected to the second connection node, wherein the second compensation output node is connected to the biasing node, wherein the temperature compensating portion includes a first temperature compensating transistor; the first temperature compensating transistor being diode-connected, coupled between the first and second compensation output nodes and configured to operate in a subthreshold condition, and wherein the temperature compensating portion includes a first filtering capacitor coupled between the second compensation output node and a reference potential line and a second filtering capacitor coupled between the first compensation output node and the reference potential line.

16. The envelope detector circuit of claim 15, wherein the temperature compensating portion further comprises:

a second temperature compensating transistor, the second temperature compensating transistor being diode-connected and coupled between a supply line and the second compensation output node;

a third temperature compensating transistor, the third temperature compensating transistor being mirror-like coupled to the second temperature compensating transistor and coupled between the supply line and the second compensation output node;

a fourth temperature compensating transistor, the fourth temperature compensating transistor being mirror-like coupled to the first temperature compensating transistor and coupled between the first and second compensation output nodes;

a fifth temperature compensating transistor, the fifth temperature compensating transistor being diode-connected and coupled between the first compensation output node and the reference potential line; and a resistor element coupled between the fourth temperature compensating transistor and the first compensation output node.

17. The envelope detector circuit of claim 16, wherein the first, the fourth and the fifth temperature compensating transistors are NMOS type transistors, and the second and the third temperature compensating transistors are PMOS type transistors.

18. The envelope detector circuit of claim 16, further comprising a third filtering capacitor coupled between a respective gate terminal of the second and third temperature compensating transistors and the reference potential line.

19. The envelope detector circuit of claim 16, wherein the first and fourth temperature compensating transistors comprise a respective gate region each characterized by respective widths and lengths, wherein a ratio between the width and length of the gate region of the fourth temperature compensating transistor is N times a ratio between the width and length of the gate region of the first temperature compensating transistor, with N greater than 1.

* * * * *